United States Patent [19]

Chen

[11] Patent Number: 5,805,615
[45] Date of Patent: Sep. 8, 1998

[54] METHOD AND APPARATUS FOR ENCODING CERTAIN DOUBLE-ERROR CORRECTING AND TRIPLE-ERROR DETECTING CODES

[75] Inventor: Chin-Long Chen, Fishkill, N.Y.

[73] Assignee: International Business Machines Corporation, Armonk, N.Y.

[21] Appl. No.: 705,371

[22] Filed: Aug. 29, 1996

[51] Int. Cl.⁶ .................................................. H03M 13/00
[52] U.S. Cl. ............................................................ 371/37.6
[58] Field of Search ............................................ 371/37.6

[56] References Cited

U.S. PATENT DOCUMENTS

| | | |
|---|---|---|
| 3,825,893 | 7/1974 | Bossen et al. .................. 340/146.1 AL |
| 4,556,977 | 12/1985 | Olderdissen et al. ...................... 371/37 |
| 5,537,427 | 7/1996 | Chen ...................................... 371/37.1 |
| 5,600,659 | 2/1997 | Chen ...................................... 371/37.1 |

*Primary Examiner*—Stephen M. Baker
*Attorney, Agent, or Firm*—Lawrence D. Cutter

[57] ABSTRACT

BCH error correcting code principles are employed in conjunction with normal basis representation of field elements to provide apparatus and method for encoding and decoding binary electrical signals in a way which ensures the ability to correct all double-bit errors and to detect all triple-bit errors. Both the encoder and decoder are designed in a fashion which permits modular implementation so as to make the circuits more compact and easier to layout.

2 Claims, 6 Drawing Sheets

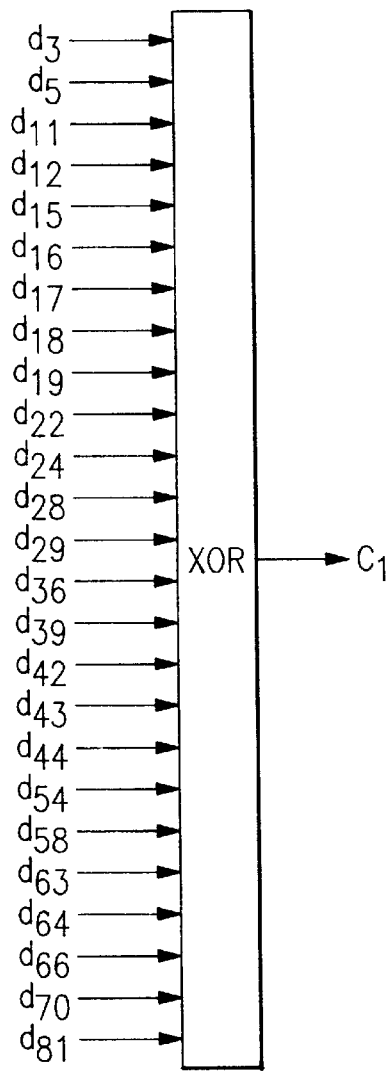
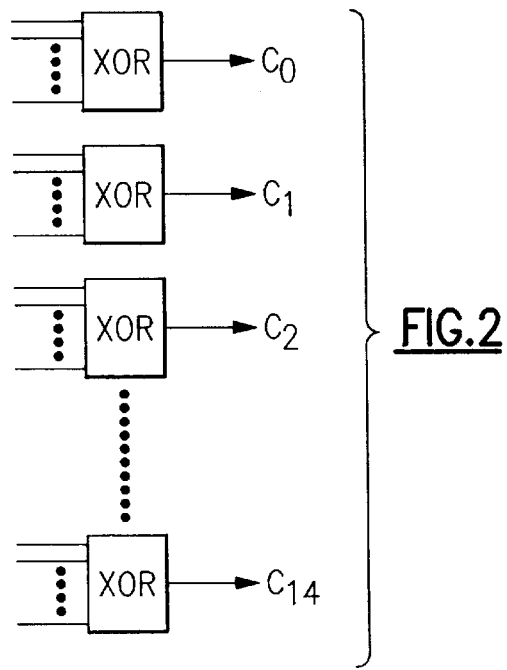
FIG.1
FIG.2

METHOD AND APPARATUS FOR ENCODING CERTAIN DOUBLE-ERROR CORRECTING AND TRIPLE-ERROR DETECTING CODES

BACKGROUND OF THE INVENTION

The present invention is generally directed to the encoding and decoding of binary data using error correction and detection methods. An apparatus for decoding specific codes is also provided and implemented in a fashion which exploits code structure to provide encoders and decoders which minimize circuit costs, particularly with respect to the number of circuits required both for encoding and for decoding. More particularly, the encoding and decoding embodiments of the present invention take advantage of modular aspects which are designed into the error correction coding methodology.

The utilization of error correction and detection codes in electronic data processing and transmission systems is becoming more and more important for several reasons. In particular, increased problem complexity and security concerns require ever increasing levels of reliability in data transmission. Furthermore, the increased use of high-density, very large-scale integrated circuit chips for use in memory systems has increased the potential for the occurrence of soft errors such as those induced by alpha particle background radiation effects. Accordingly, it has become more desirable to be able to protect memory system integrity against the occurrence of multi-bit errors in order to enhance system integrity. Thus, it is seen that it is desirable to employ error correction coding systems which take advantage of additional check bits stored in the memory system to minimize the probability of error.

As the desire and necessity for increased levels of data integrity arise, the requirements for error correction increase. Accordingly, the present invention provides a mechanism for encoding binary signals in a fashion which provides a capability for detecting triple errors in a code word and which also has the capability to correct double errors when they occur.

However, for this increased level of error correction capability, there is usually a corresponding price to pay in terms of electrical circuit complexity. However, the present code is designed in a modular fashion so that both the encoding and decoding of binary electrical signals can be accomplished with modular sets of electrical circuits.

The ability to provide circuit modularity produces a number of benefits including ease of laying out the circuit design for both check bit and syndrome-generating circuits. The modular nature of these circuits makes it possible for them to be designed more compactly and laid out in a more flexible manner.

In the present application, the term "modular" is applied in the following sense. In particular, for check bit generation, blocks of circuits having the same structure are employed. (The same is true in syndrome generation.) The only difference is that different input signal lines are supplied to these different blocks. The identical nature of these blocks, from an electrical and physical structural view point, provides the capability for their orderly disposition on a semiconductor chip. In particular, for purposes of the present invention, the circuits described herein are typically and preferably found on memory circuit chips.

SUMMARY OF THE INVENTION

In accordance with a preferred embodiment of the present invention, BCH coding theory is employed to construct a double error correcting and triple error detecting code with code length n which is constructed from a specified parity check matrix. In particular, the present invention structures the parity check matrix for ease of implementation and also simultaneously for the minimization of the number of circuits employed in the encoding and decoding circuits. The present invention employs the specific representation of finite field elements found in BCH parity check matrix descriptions wherein each field element is expressed as a linear combination of linearly independent field elements. In particular, in the present invention, a normal basis is employed for this representation. Using the normal basis representation, it is seen that the parity check matrix can, in general, be constructed from matrices which are identical except for single-row permutations. These so-called rotational matrices offer advantages in the modular implementation used in the generation of check bits and also in the generation of syndrome bits and in the decoding of syndrome bits to obtain error locations. The same circuits used to generate partial check bits of a submatrix are used to generate partial check bits of a rotational submatrix. Thus, circuits can be replicated for different data inputs.

The number of ones in a parity check matrix is proportional to the number of circuits required to generate the check bits. Therefore, to minimize the number of circuits, it is desirable to minimize the number of ones in this check matrix. In accordance with the present invention, the parity check matrix provided has a minimum number of ones amongst all of the normal bases for the specific finite field elements employed.

In the present invention, therefore, a circuit and method are provided for encoding binary electrical signals. Additionally, a method and apparatus are provided for decoding the electrical signals, typically as provided from a memory system register and for processing these signals to correct double errors and to provide an indication of the occurrence of a triple error. Additionally, means are also shown whereby other uncorrectable errors may be indicated as being present.

Accordingly, it is an object of the present invention to permit the design of parity check matrices and syndrome matrices having minimal weight, that is, having a minimum number of ones in their structures.

It is yet another object of the present invention to construct error correcting codes and encoding apparatus which consume minimal amounts of circuitry, particularly as measured with respect to area consumed on VLSI-sized circuit chips.

It is also an object of the present invention to construct error correcting codes which are particularly applicable to computer memory systems.

It is a still further object of the present invention to extend the mean time between failure associated with computer memory systems.

It is also an object of the present invention to improve computer system reliability and, in particular, computer memory system reliability.

Lastly, but not limited hereto, it is an object of the present invention to implement low cost error correcting codes which enhance computer storage integrity, reliability and serviceability.

BRIEF DESCRIPTION OF THE DRAWINGS

The subject matter which is regarded as the invention is particularly pointed out and distinctly claimed in the concluding portion of the specification. The invention, however, both as to organization and method of practice, together with the further objects and advantages thereof, may best be understood by reference to the following description taken in connection with the accompanying drawings in which:

FIG. 1 is a functional block diagram illustrating the electrical circuit design employed in the generation of a single check bit;

FIG. 2 is a functional block diagram illustrating the overall construction of the entire check bit generation system;

DETAILED DESCRIPTION OF THE INVENTION

Figure 3:
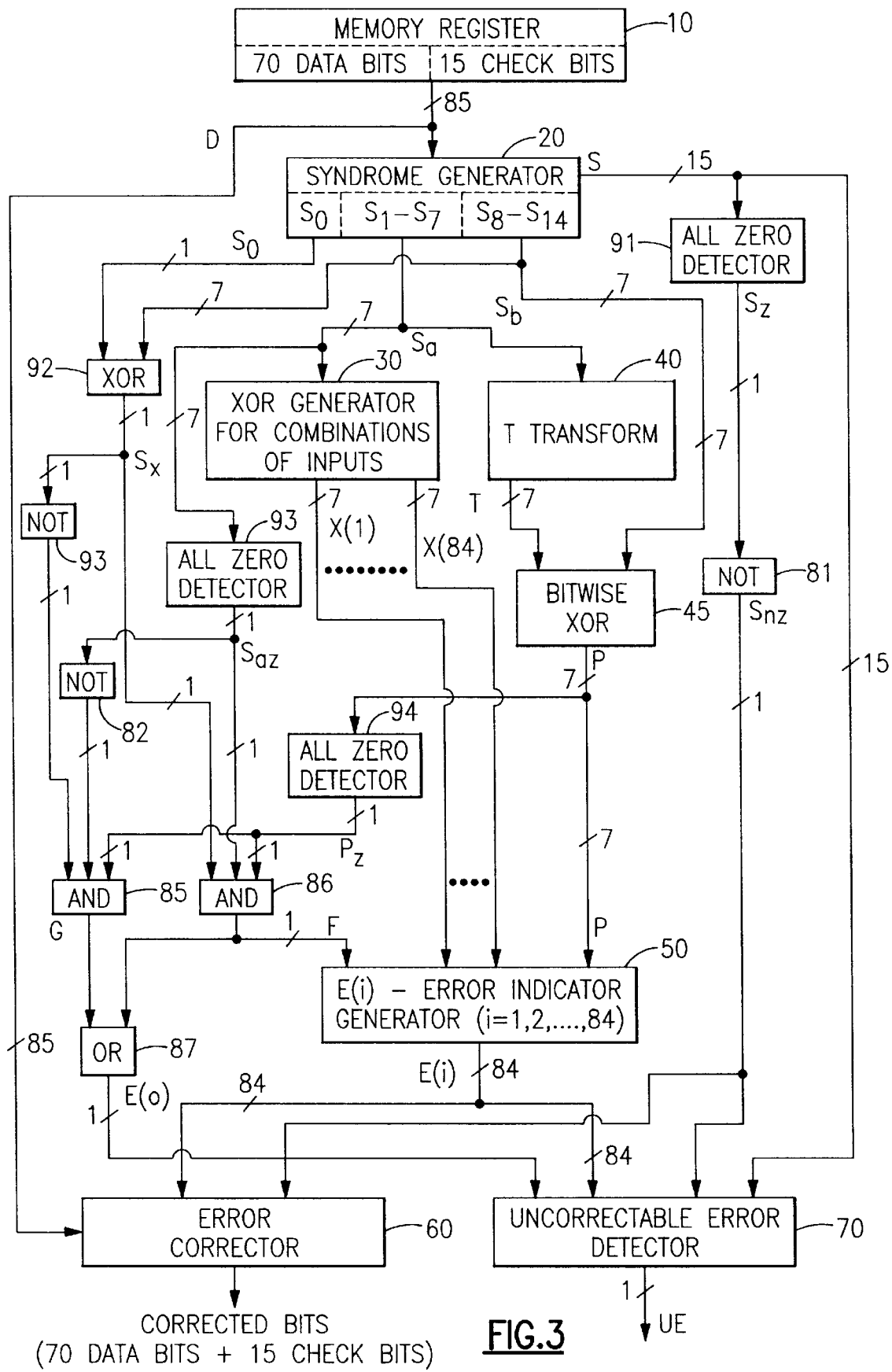
FIG. 3 is a functional block diagram illustrating the construction of error correction circuitry which is constructed in accordance with the structures associated with the specific parity check bit matrices described herein for achieving triple error detection and double error correction.

The error correction and detection method and apparatus of the present invention is based upon BCH coding theory. This theory teaches that a double-error correcting and triple-error detecting (DEC-TED) code with a code word length n can be constructed using a parity check matrix having the following form:

$$H = \begin{bmatrix} \alpha^0 \, \alpha^0 \, \alpha^0 \ldots \alpha^0 \ldots \alpha^0 \\ \alpha^0 \, \alpha^1 \, \alpha^2 \ldots \alpha^i \ldots \alpha^{n-1} \\ \alpha^0 \, \alpha^3 \, \alpha^6 \ldots \alpha^{3i} \ldots \alpha^{3(n-1)} \end{bmatrix} \quad \text{Equation 1}$$

The finite field elements $\alpha^i$ in the above matrix are powers of a root of an irreducible polynomial over the Galois field $GF(2^m)$. This polynomial is a polynomial of degree m having binary co-efficients. In the example set forth in the present application, this polynomial may be considered to be either of the following:

$$p(x)=1+x^3+x^7 \quad \text{Equation 2}$$

or $$p(x)=1+x^4+x^7$$

Thus, for the examples set forth herein, m equals 7.

The finite field elements $\alpha^i$ are also expressible as a binary linear combination of powers of a primitive root $\alpha$ of the irreducible polynomial p(x). For example, $\alpha^i$ may be expressed as a linear combination in the following manner:

$$\alpha^i = a_{j0}\alpha^0 + a_{j1}\alpha^1 + a_{j2}\alpha^2 + \ldots + a_{j(m-1)}\alpha^{m-1} \quad \text{Equation 3}$$

Wherein each $a_{jk}$ is a binary number. This is made possible in a finite field since the powers of the field elements will eventually repeat as the exponent is raised to increasingly higher values. Thus, the field element $\alpha^i$ is expressible as the following m bit binary vector:

$$\alpha^i = (a_{j0}, a_{j1}, a_{j2}, \ldots, a_{j(m-1)}) \quad \text{Equation 4}$$

Now, if $W=(w_0, w_1, w_2, \ldots, w_{n-1})$ is an n bit binary input vector, it is also a code word of the code if, and only if, it satisfies the parity check equation:

$$HW^t = H \begin{pmatrix} w_0 \\ w_1 \\ w_2 \\ . \\ . \\ . \\ w_{n-1} \end{pmatrix} = 0 \, (\text{mod } 2) \quad \text{Equation 5}$$

where $W^t$ is the transpose of the n bit binary vector W.

However, a better way to construct the parity check matrix is to express the finite field elements using a normal basis. In particular, if $$\alpha^{2^0}, \alpha^{2^1}, \alpha^{2^2}, \ldots, \alpha^{2^{(m-1)}}$$

are linearly independent field elements in the Galois field, then they form a normal basis for the finite Galois field of $2^m$ elements. In this case, a finite field element $\alpha^i$ is then expressible in the following fashion:

$$\alpha^i = a_{j0}\alpha^{2^0} + a_{j1}\alpha^{2^1} + a_{j2}\alpha^{2^2} + \ldots + a_{j(m-1)}\alpha^{2^{(m-1)}} \quad \text{Equation 7}$$

(or in vector form)

$$\alpha^i = (a_{j0}, a_{j1}, a_{j2}, \ldots, a_{j(m-1)})$$

The interesting part of the aspect of expressing powers of field elements as linear combinations of a normal basis is the result that is achieved relating to cyclic shifts. In particular, when one uses a normal basis, if one then multiplies $\alpha^i$ by $\alpha^i$ to produce $\alpha^{2i}$, then the following relationships are seen to hold:

$$\begin{aligned} \alpha^{2i} &= a_{j0}\alpha^{2^1} + a_{j1}\alpha^{2^2} + a_{j2}\alpha^{2^3} + \ldots + a_{j(m-1)}\alpha^{2^m} \quad \text{Equation 7} \\ &= a_{j(m-1)}\alpha^{2^0} + a_{j0}\alpha^{2^1} + a_{j1}\alpha^{2^2} + \ldots + a_{j(m-2)}\alpha^{2^{(m-1)}} \\ &= (a_{j(m-1)}, a_{j0}, a_{j1}, \ldots, a_{j(m-2)}) \end{aligned}$$

Thus, it is seen that the effect of multiplying by $\alpha^i$ is to produce a field element which is representable in the normal basis by a cyclic shift of the representation of $\alpha^i$. Thus, the binary vector expression for $\alpha^{2i}$ is a simple cyclic shift of the vector representation of $\alpha^i$ in a normal basis. It is thus seen then that the parity check matrix can be constructed from rotational submatrices. That is, the parity check matrix contains submatrices of the form:

$$\begin{bmatrix} v_1 & v_c & \ldots \\ v_2 & v_1 & \ldots \\ . & . & \ldots \\ . & . & \ldots \\ . & . & \ldots \\ v_c & v_{c-1} & \ldots \end{bmatrix} \quad \text{Equation 8}$$

where the $v_i$ are row vectors. It is noted that the structure for the parity check matrix H set out in Equation 1 is of this form where each succeeding column is seen to be a product of elements in the preceding column with a corresponding element from column 2. This is the same progression as suggested in the development of Equation 7 above.

Thus, the result of utilizing a normal basis is the production of so-called rotational submatrices in the parity check matrix H. These rotational matrices offer advantages in the modular implementation of check bit and syndrome generation. The same circuits used to generate partial check bits of a submatrix are also used to generate partial check bits of a rotational submatrix. Thus, the circuits can be replicated and used to produce different and useful outputs simply by providing a different combination of inputs.

Furthermore, it is noted that the number of "ones" in a parity check matrix is proportional to the number of circuits required to generate the check bits (or the syndrome bits). To minimize the number of circuits is to minimize the number of "ones" in the parity check matrix. With respect to the particular parity check matrix which is more particularly described below, it is noted that it has been specifically designed to have a minimum number of "ones" amongst the parity check matrices representable using normal basis of the finite field of $2^7$ (=128) field elements. With respect to the specific decoding apparatus and decoding method employed herein, it is seen that it generally follows the techniques set forth in U.S. Pat. No. 4,556,977 issued Dec. 3, 1985, which is also assigned to the present assignee. However, the detailed decoding logic is different for the present application since the present inventor has employed a normal basis in the construction of the parity check matrix.

By way of example, and not limitation, utilization of the above-described techniques for parity check matrix construction are now employed in the design of a code with a code word length of 85 bits which comprise 70 data bits and 15 check bits. This code is constructed in accordance with the BCH coding principles set forth above and is thus able to correct double errors and to detect triple errors. A preferred embodiment of the present invention employs an appropriate parity check matrix H as set forth in the table below:

In the above table, it is noted that check bits are located at bit positions 0, 1, 2, 13, 14, 25, 26, 37, 38, 49, 50, 61, 62, 73 and 74. The check bits are designated as columns C0–C14 in Table I. Note that the parity check matrix H in Table I is completely specified by the first 13 columns of the matrix. More specifically, excluding the first column, the parity check matrix is seen to be grouped into seven columns of submatrices wherein each submatrix column has 15 rows and 12 columns. Furthermore, it is seen that, as indicated by the spacing in Table 1, apart from the first column and the first row, the entire parity check matrix H is comprised of row permutations of two matrices $H_0$ and $H_1$ wherein these matrices are seen to be specified by the following equations:

$$H_0 = \begin{bmatrix} 101010000011 \\ 000000011000 \\ 001101000100 \\ 000001000100 \\ 001001110000 \\ 000110000001 \\ 001111100101 \end{bmatrix}$$

$$H_1 = \begin{bmatrix} 011011011010 \\ 000000101110 \\ 001000011110 \\ 000100011001 \\ 000001001111 \\ 001001000000 \\ 000010100101 \end{bmatrix}$$

Equation 9

It is to be particularly noted that the submatrix $H_0$ in parity check matrix H is repeated in columns 13–24 in Table I except that the first row has been moved to the second row position, the second row to the third row position, etc., with the last row being moved back up to the first row position in a cyclic permutation. This pattern repeats resulting in a parity check matrix of the following form:

TABLE I

| c0 | cc 12 | cc 34 | cc 56 | cc 78 | cc 1 90 12 | cc 11 12 | cc 11 34 | check bits |
|---|---|---|---|---|---|---|---|---|
| 0 | 111 123456789012 | 111111122222 345678901234 | 222223333333 567890123456 | 333444444444 789012345678 | 455555555556 901234567890 | 666666666777 123456789012 | 777777788888 345678901234 | bit positions |
| 1 | 000100101001 | 000100101001 | 000100101001 | 000100101001 | 000100101001 | 000100101001 | 000100101001 | |
| 0 | 101010000011 | 001111100101 | 000110000001 | 001001110000 | 000001000100 | 001101000100 | 000000011000 | |
| 0 | 000000011000 | 101010000011 | 001111100101 | 000110000001 | 001001110000 | 000001000100 | 001101000100 | |
| 0 | 001101000100 | 000000011000 | 101010000011 | 001111100101 | 000110000001 | 001001110000 | 000001000100 | |
| 0 | 000001000100 | 001101000100 | 000000011000 | 101010000011 | 001111100101 | 000110000001 | 001001110000 | |
| 0 | 001001110000 | 000001000100 | 001101000100 | 000000011000 | 101010000011 | 001111100101 | 000110000001 | |
| 0 | 000110000001 | 001001110000 | 000001000100 | 001101000100 | 000000011000 | 101010000011 | 001111100101 | parity check |
| 0 | 001111100101 | 000110000001 | 001001110000 | 000001000100 | 001101000100 | 000000011000 | 101010000011 | matrix |
| 0 | 011011011010 | 000010100101 | 001001000000 | 000001001111 | 000100011001 | 001000011110 | 000000101110 | |
| 0 | 000000101110 | 011011011010 | 000010100101 | 001001000000 | 000001001111 | 000100011001 | 001000011110 | |
| 0 | 001000011110 | 000000101110 | 011011011010 | 000010100101 | 001001000000 | 000001001111 | 000100011001 | |
| 0 | 000100011001 | 001000011110 | 000000101110 | 011011011010 | 000010100101 | 001001000000 | 000001001111 | |
| 0 | 000001001111 | 000100011001 | 001000011110 | 000000101110 | 011011011010 | 000010100101 | 001001000000 | |
| 0 | 001001000000 | 000001001111 | 000100011001 | 001000011110 | 000000101110 | 011011011010 | 000010100101 | |
| 0 | 000010100101 | 001001000000 | 000001001111 | 000100011001 | 001000011110 | 000000101110 | 011011011010 | |

$$H = \begin{pmatrix} 1 & \beta & \beta & \beta & \beta & \beta & \beta & \beta \\ O_7 & H_0 & RH_0 & R^2H_0 & R^3H_0 & R^4H_0 & R^5H_0 & R^6H_0 \\ O_7 & H_1 & RH_1 & R^2H_1 & R^3H_1 & R^4H_1 & R^5H_1 & R^6H_1 \end{pmatrix} \quad \text{Equation 10}$$

wherein $\beta$ is the row vector specified in the following equation:

$$\beta = (000100101001) \quad \text{Equation 11}$$

and wherein $O_7$ is the all-zero column vector with seven zero elements as specified below:

$$O_7 = \begin{pmatrix} 0 \\ 0 \\ 0 \\ 0 \\ 0 \\ 0 \\ 0 \end{pmatrix} . \quad \text{Equation 12}$$

In Equation 10, R is a permutation matrix which cyclically shifts one row of submatrix $H_0$ or $H_1$ in a downward direction. However, cyclic shifts in the opposite direction are also in keeping with the present invention.

Exclusive-OR gates are used to generate the check bits in accordance with well-understood principles of error correction code and circuit design. Each row of the parity check matrix defines a parity check equation which all code words have to satisfy. It also defines the data bits that are exclusive-ORed for the generation of a check bit. For example, FIG. 1 shows the exclusive-ORing of the necessary data bits for the generation of check bit $C_1$. A check bit is the exclusive-OR of the data bits indicated by the ones in a particular row. For example, as is shown in FIG. 1, check bit $C_1$ is the exclusive-OR of the data bits indicated by the ones in the second row of the parity check matrix, that is, the exclusive-OR of data bits 3, 5, 11, 12, 15–19, 22, 24, 28, 29, 36, 39, 42–44, 54, 58, 63, 64, 66, 70, 80 and 81. Since there are 15 rows in parity check matrix H, there are 15 circuits similar to the one shown in FIG. 1 for $C_1$. It is also fully appreciated by those skilled in this art that exclusive-ORing is an associative and commutative operation just like arithmetic addition and, accordingly, it is understood that because of circuit limitations in various electrical circuit technologies, a single exclusive-OR gate is not generally employed, but rather, they are arranged in balanced trees to minimize the signal propagation path through different tree layers.

Since there are 15 rows in matrix H in Table 1, it is seen that there are 15 check bits generated using 15 different exclusive-OR functional blocks as shown in FIG. 2. The inputs to the exclusive-OR functional blocks shown in FIG. 2 are determined by the corresponding ones in the corresponding rows in matrix H which is really a blueprint or schematic diagram for the encoding circuit. Accordingly, it is seen that FIGS. 1 and 2, together with parity check matrix H, provide a full and complete understanding of the construction of an electrical circuit apparatus for encoding digital electrical signals in accordance with the present invention. Furthermore, it is noted that the various matrices $H_0$ and $H_1$ from matrix H are dependent upon the minimal polynomial p(x) which is selected from $GF(2^7)$. In this particular instance, there are a limited number of possibilities and it is, therefore, seen that it is possible to exhaustively consider all possible values of p(x) which are suitable candidate polynomials. There are, in fact, only 18 such different, possible primitive polynomials in the present case. Accordingly, the polynomial $p(x)=1+x+x^2+x^4+x^5+x^6+x^7$ was chosen since its utilization resulted in the smallest number of non-zero entries in matrix H.

Attention is now directed the method and apparatus employed to decode signals which have been encoded using the parity check matrix H from Table I. In particular, a circuit for carrying out this operation is illustrated in FIG. 3.

FIG. 3 illustrates both an apparatus and method for error correction and detection when a parity check matrix, such as H shown in Equation 10 above, is employed. In particular, FIG. 3 illustrates an apparatus employed when error correction is employed in a computer memory system. In particular, it is seen that memory register 10 holds the 70 data bits and 15 check bits associated with the parity check matrix of Table I. These 85 bits are supplied to syndrome generator 20. Syndrome generation is carried out in the same way as parity check generation using exclusive-OR gates. However, in preferred embodiments, the syndrome generator matrix employed is that which is shown in Table II below.

TABLE II

| 0 | 111<br>123456789012 | 111111122222<br>345678901234 | 222223333333<br>567890123456 | 333444444444<br>789012345678 | 455555555556<br>901234567890 | 666666686777<br>123456789012 | 777777788888<br>345678901234 |
|---|---|---|---|---|---|---|---|
| 1 | 000100101001 | 000100101001 | 000100101001 | 000100101001 | 000100101001 | 000100101001 | 000100101001 |
| 0 | 111011110011 | 000001010110 | 000010001001 | 000100010110 | 010110110111 | 011100001011 | 010000001001 |
| 0 | 010000001001 | 111011110011 | 000001010110 | 000010001001 | 000100010110 | 010110110111 | 011100001011 |
| 0 | 011100001011 | 010000001001 | 111011110011 | 000001010110 | 000010001001 | 000100010110 | 010110110111 |
| 0 | 010110110111 | 011100001011 | 010000001001 | 111011110011 | 000001010110 | 000010001001 | 000100010110 |
| 0 | 000100010110 | 010110110111 | 011100001011 | 010000001001 | 111011110011 | 000001010110 | 000010001001 |
| 0 | 000010001001 | 000100010110 | 010110110111 | 011100001011 | 010000001001 | 111011110011 | 000001010110 |
| 0 | 000001010110 | 000010001001 | 000100010110 | 010110110111 | 011100001011 | 010000001001 | 111011110011 |
| 0 | 110000010000 | 100000100110 | 110101011101 | 100100010000 | 010010100111 | 010011101001 | 111011100011 |
| 0 | 111011100011 | 110000010000 | 100000100110 | 110101011101 | 100100010000 | 010010100111 | 010011101001 |
| 0 | 010011101001 | 111011100011 | 110000010000 | 100000100110 | 110101011101 | 100100010000 | 010010100111 |
| 0 | 010010100111 | 010011101001 | 111011100011 | 110000010000 | 100000100110 | 110101011101 | 100100010000 |
| 0 | 100100010000 | 010010100111 | 010011101001 | 111011100011 | 110000010000 | 100000100110 | 110101011101 |
| 0 | 110101011101 | 100100010000 | 010010100111 | 010011101001 | 111011100011 | 110000010000 | 100000100110 |
| 0 | 100000100110 | 110101011101 | 100100010000 | 010010100111 | 010011101001 | 111011100011 | 110000010000 |

The Table II matrix for syndrome generation is obtained according to Equation 1 using a normal basis and grouping columns to form rotational submatrices. Since one would need a "systematic matrix" for check bit generation, the matrix of Table II is transformed by elementary row operations into the matrix of Table I. Both matrices of Table I and Table II define the same vector space, i.e, the same code. Columns 0, 1, 2, 13, 14, 25, 26, 37, 38, 49, 50, 61, 62, 73 and 74 of Table I form an identity matrix, and these column positions are designated the check bit positions.

Using the same procedure described above for the generation of check bits, it is seen that syndrome generator matrix S in Table II completely describes a set of exclusive-OR gates and their input signal lines for generating the desired 15 syndrome bits designated $s_0$ through $s_{14}$. One aspect of the present invention is that the syndrome S is divided into three parts: the first bit $s_0$, followed by two 7-bit segments designated $s_1$ through $s_7$ and $s_8$ through $s_{14}$, respectively. Bits $s_1$ through $S_7$ are designated as $s_a$ herein for convenience. Likewise, the second half of the syndrome bits, namely, bits $s_8$ through $s_{14}$, are designated as $s_b$. It is essentially noted that syndrome generator 20 equivalently performs a modulo 2 matrix multiplication of syndrome generator matrix S from Table II and the received sequence of bits $D_0$ through $D_{84}$.

The essential operation of error indication generation is carried out in functional block 50 shown in FIG. 3. However, before considering the structure of this block, it is necessary to consider the operation of two other ones of the functional blocks shown in FIG. 3, namely, exclusive-OR generator 30 and so-called T transform 40.

Figure 4:
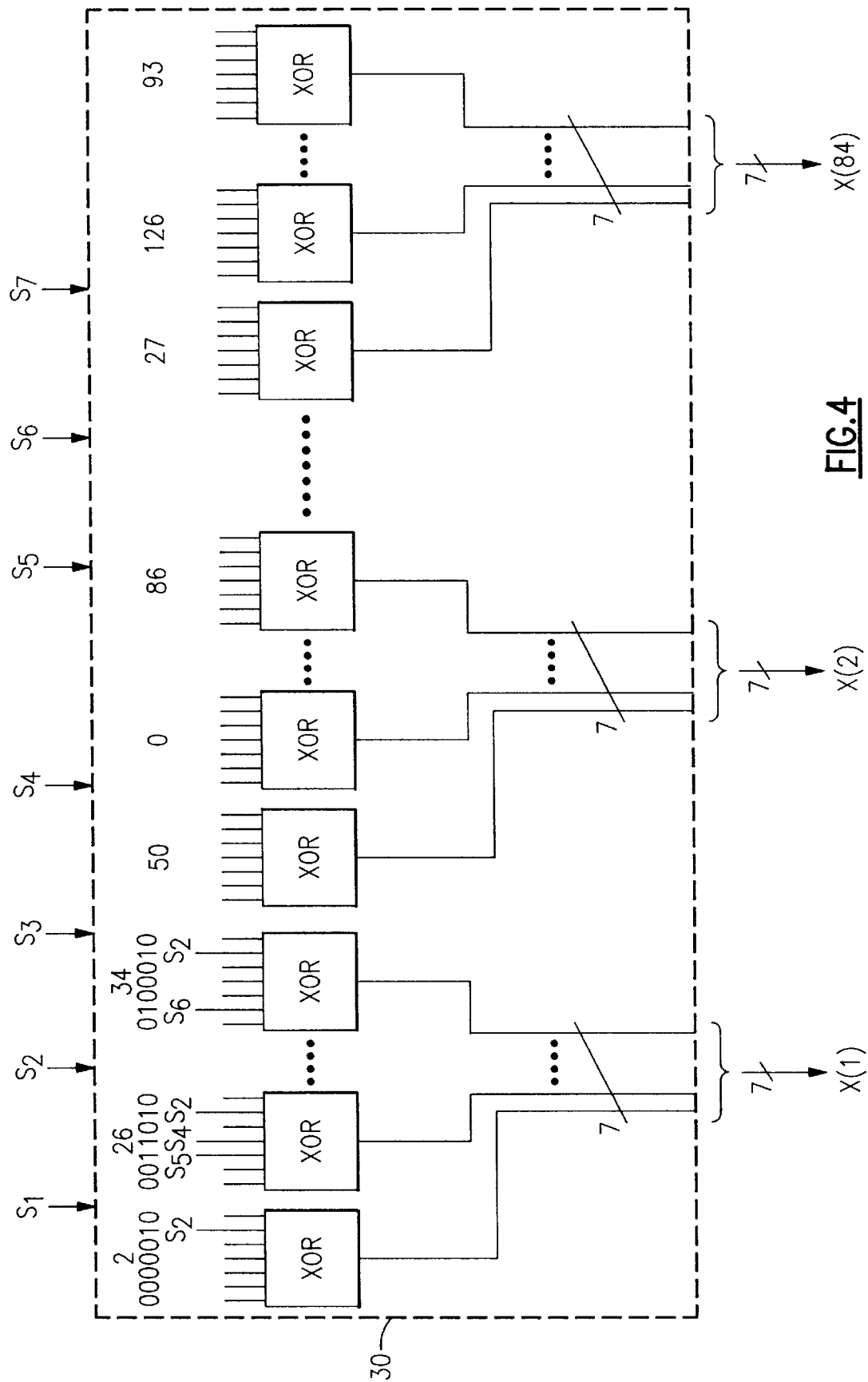
FIG. 4 is a functional block diagram illustrating the exclusive-OR generator for combinations of inputs shown in FIG. 3.

The structure of functional block 30 is shown in FIG. 4. Functional block 30 receives syndrome generator bits $s_1$ through $S_7$ and produces 84 sets of 7 output signals. Each of these 7-bit signals arises from a single exclusive-OR gate which receives a certain combination of the input syndrome bits. The input signals to these various exclusive-OR gates is shown in FIG. 4. Functional block 30, is particularly described in Table III below.

TABLE III

| Bit i | X(i) Line ID of XOR COMBINATIONS | | | | | | |
|---|---|---|---|---|---|---|---|
| 1 | 2 | 26 | 23 | 51 | 48 | 29 | 34 |
| 2 | 50 | 0 | 126 | 30 | 47 | 27 | 86 |
| 3 | 37 | 82 | 87 | 117 | 85 | 113 | 46 |
| 4 | 58 | 24 | 13 | 116 | 86 | 79 | 3 |
| 5 | 88 | 4 | 114 | 103 | 26 | 103 | 124 |
| 6 | 54 | 52 | 113 | 83 | 10 | 89 | 38 |
| 7 | 4 | 73 | 51 | 19 | 19 | 111 | 20 |
| 8 | 43 | 100 | 60 | 97 | 57 | 122 | 41 |
| 9 | 106 | 4 | 12 | 121 | 53 | 124 | 42 |
| 10 | 41 | 126 | 43 | 82 | 9 | 103 | 11 |
| 11 | 12 | 44 | 124 | 39 | 92 | 22 | 37 |
| 12 | 110 | 77 | 63 | 106 | 38 | 19 | 62 |
| 13 | 17 | 1 | 13 | 75 | 89 | 24 | 78 |
| 14 | 43 | 25 | 0 | 63 | 15 | 87 | 77 |
| 15 | 23 | 82 | 41 | 107 | 122 | 106 | 120 |
| 16 | 65 | 29 | 12 | 70 | 58 | 43 | 103 |
| 17 | 62 | 44 | 2 | 57 | 115 | 13 | 115 |
| 18 | 19 | 27 | 26 | 120 | 105 | 5 | 108 |
| 19 | 10 | 2 | 100 | 89 | 73 | 73 | 119 |
| 20 | 84 | 85 | 50 | 30 | 112 | 92 | 61 |
| 21 | 21 | 53 | 2 | 6 | 124 | 90 | 62 |
| 22 | 69 | 84 | 63 | 85 | 41 | 68 | 115 |
| 23 | 82 | 6 | 22 | 62 | 83 | 46 | 11 |
| 24 | 31 | 55 | 102 | 95 | 53 | 19 | 73 |
| 25 | 39 | 72 | 64 | 70 | 101 | 108 | 12 |
| 26 | 102 | 85 | 76 | 0 | 95 | 71 | 107 |
| 27 | 60 | 75 | 41 | 84 | 117 | 61 | 53 |
| 28 | 115 | 96 | 78 | 6 | 35 | 29 | 85 |
| 29 | 121 | 31 | 22 | 1 | 92 | 121 | 70 |

TABLE III-continued

| Bit i | X(i) Line ID of XOR COMBINATIONS | | | | | | |
|---|---|---|---|---|---|---|---|
| 30 | 54 | 73 | 77 | 13 | 60 | 116 | 66 |
| 31 | 123 | 5 | 1 | 50 | 108 | 100 | 100 |
| 32 | 94 | 42 | 106 | 25 | 15 | 56 | 46 |
| 33 | 31 | 74 | 90 | 1 | 3 | 62 | 45 |
| 34 | 121 | 98 | 42 | 95 | 106 | 84 | 34 |
| 35 | 69 | 41 | 3 | 11 | 31 | 105 | 23 |
| 36 | 100 | 79 | 91 | 51 | 111 | 90 | 73 |
| 37 | 6 | 83 | 36 | 32 | 35 | 114 | 54 |
| 38 | 117 | 51 | 106 | 38 | 0 | 111 | 99 |
| 39 | 90 | 30 | 101 | 84 | 42 | 122 | 94 |
| 40 | 106 | 121 | 48 | 39 | 3 | 81 | 78 |
| 41 | 35 | 124 | 79 | 11 | 64 | 46 | 124 |
| 42 | 33 | 27 | 100 | 102 | 70 | 30 | 58 |
| 43 | 50 | 125 | 66 | 64 | 25 | 54 | 50 |
| 44 | 23 | 47 | 21 | 53 | 76 | 71 | 28 |
| 45 | 86 | 79 | 37 | 45 | 64 | 65 | 31 |
| 46 | 17 | 124 | 49 | 21 | 111 | 53 | 42 |
| 47 | 75 | 98 | 84 | 65 | 69 | 79 | 116 |
| 48 | 100 | 50 | 103 | 109 | 89 | 119 | 45 |
| 49 | 27 | 3 | 105 | 18 | 16 | 81 | 57 |
| 50 | 113 | 122 | 89 | 53 | 19 | 0 | 119 |
| 51 | 47 | 45 | 15 | 114 | 42 | 21 | 61 |
| 52 | 39 | 53 | 124 | 24 | 83 | 65 | 104 |
| 53 | 62 | 81 | 62 | 103 | 69 | 32 | 23 |
| 54 | 29 | 80 | 77 | 50 | 51 | 35 | 15 |
| 55 | 25 | 25 | 126 | 33 | 32 | 76 | 27 |
| 56 | 14 | 75 | 87 | 74 | 90 | 38 | 99 |
| 57 | 79 | 43 | 103 | 82 | 86 | 32 | 96 |
| 58 | 21 | 72 | 62 | 88 | 74 | 119 | 90 |
| 59 | 58 | 101 | 49 | 42 | 96 | 98 | 103 |
| 60 | 86 | 50 | 25 | 115 | 118 | 108 | 123 |
| 61 | 92 | 77 | 65 | 116 | 9 | 8 | 104 |
| 62 | 123 | 120 | 61 | 108 | 90 | 73 | 0 |
| 63 | 94 | 87 | 86 | 71 | 57 | 21 | 74 |
| 64 | 52 | 83 | 90 | 62 | 12 | 105 | 96 |
| 65 | 75 | 31 | 104 | 31 | 115 | 98 | 16 |
| 66 | 71 | 78 | 40 | 102 | 25 | 89 | 81 |
| 67 | 77 | 76 | 76 | 63 | 80 | 16 | 38 |
| 68 | 113 | 7 | 101 | 107 | 37 | 45 | 19 |
| 69 | 48 | 103 | 85 | 115 | 41 | 43 | 16 |
| 70 | 45 | 74 | 36 | 31 | 44 | 37 | 123 |
| 71 | 115 | 29 | 114 | 88 | 21 | 48 | 49 |
| 72 | 125 | 43 | 25 | 76 | 121 | 59 | 54 |
| 73 | 52 | 46 | 102 | 96 | 58 | 68 | 4 |
| 74 | 0 | 125 | 60 | 94 | 54 | 45 | 100 |
| 75 | 37 | 47 | 107 | 43 | 99 | 92 | 74 |
| 76 | 48 | 26 | 105 | 45 | 31 | 6 | 116 |
| 77 | 8 | 101 | 79 | 52 | 79 | 121 | 49 |
| 78 | 104 | 99 | 39 | 20 | 51 | 76 | 108 |
| 79 | 19 | 102 | 38 | 38 | 95 | 40 | 8 |
| 80 | 73 | 120 | 67 | 114 | 117 | 82 | 86 |
| 81 | 8 | 24 | 115 | 106 | 121 | 84 | 85 |
| 82 | 125 | 86 | 37 | 18 | 79 | 22 | 82 |
| 83 | 88 | 121 | 78 | 57 | 44 | 74 | 24 |
| 84 | 27 | 126 | 85 | 76 | 38 | 124 | 93 |

The selected inputs are described in the following fashion. For example, for the first output of exclusive-OR generator 30, namely, X(1), see line 1 of Table III. Line 1 lists seven integers, namely, 2, 26, 23, 51, 48, 29 and 34. The sample numbers, 2, 26 and 34, are also particularly shown in the left-hand portion of FIG. 4. The numbers 23, 51, 48 and 29 are omitted for the sake of spacing and clarity. Nonetheless, each one of the integers in Table III represents a signal output line which is generated as an exclusive-OR combination of specified input bits. The specific input bits are described by the binary form of the integers listed. For example, in the first row, the integer 26 has the 7-bit binary representation (0011010). The "ones" in this integer representation represent the corresponding "ones" in the syndrome bits which are to be supplied to the exclusive-OR gates in the following corresponding order: ($s_7$ $S_6$ $s_5$ $s_4$ $s_3$ $s_2$ $s_1$). Thus, integer 26 provides an indication that syndrome bits $s_5$, $s_4$ and $s_2$ are to be supplied to an exclusive-OR gate for generation of one of the 7-bit line signals in X(1). Thus, each row in Table III represents a set or grouping of 7-bit signal lines, each designated as X(i) where i is the row indicator shown in Table III. Each of these 84 sets of 7-bit signal lines X(1) through X(84) is supplied to error indicator generator 50 which is more particularly described below.

It is noted, with respect to FIG. 4, that, in some cases, only a single bit might be present in one of the integer representations. In such cases, it is not necessary to physically provide the corresponding exclusive-OR gate. This, in particular, is seen in the left-most portion of FIG. 4 where the integer 2 clearly indicates that only the syndrome bit $s_2$ is to be provided since it is not exclusive-ORed with any other signal. The exclusive-OR gate, shown in FIG. 4 for this particular signal, is illustrated only as an example describing the overall scheme for translating between Table III and FIG. 4. Likewise, if the integer in Table III is a "zero", the corresponding bit signal line is a constant "zero".

Figure 5:
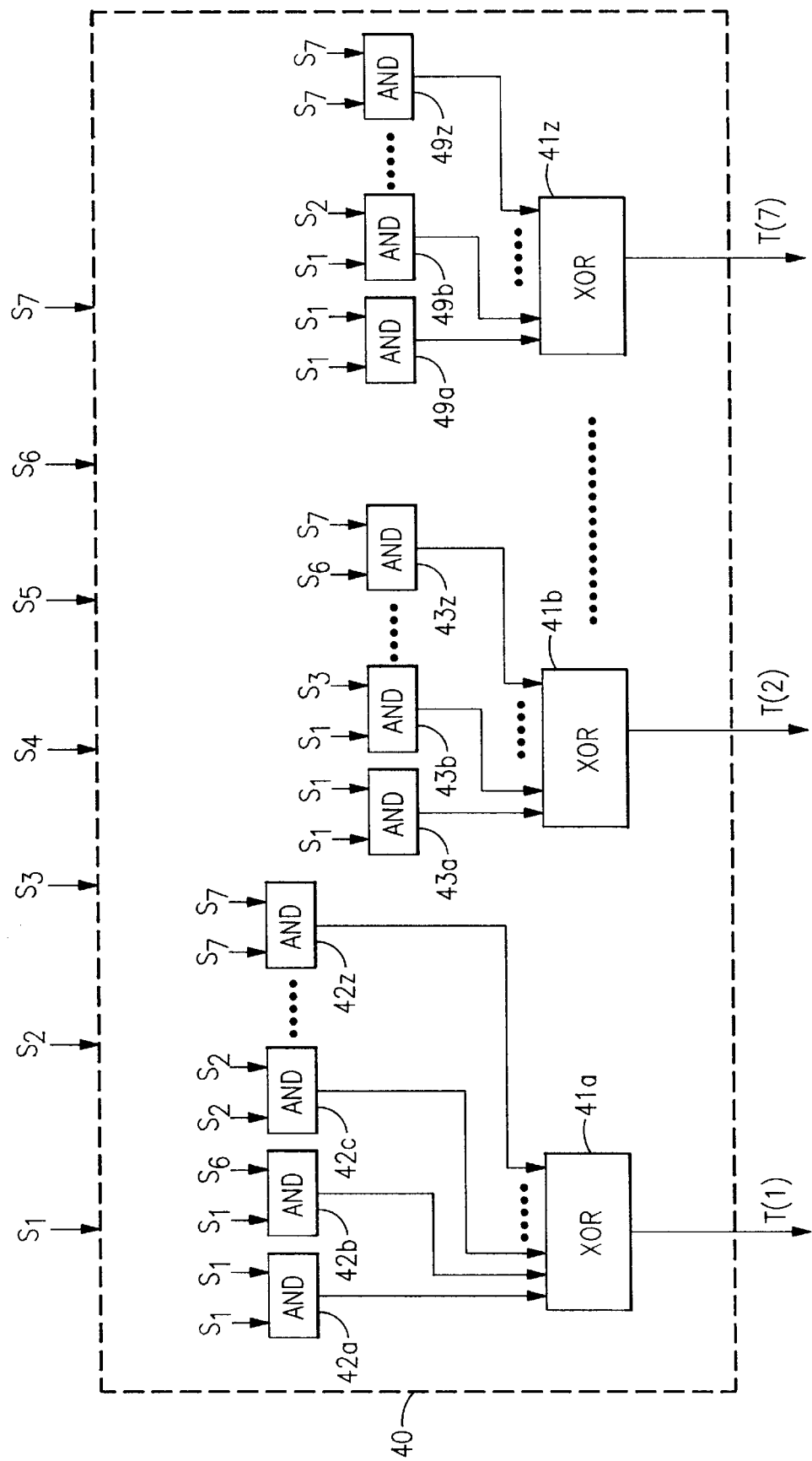
FIG. 5 is a functional block diagram illustrating the detailed construction of the T transform circuit which is shown in FIG. 3.

Next is considered the construction of T transform functional block 40 shown in FIG. 5. This functional block provides only a 7-bit output T with bits designated T(1) through (T7). Each of these output bits T(i) is the output of a single exclusive-OR gate (41a through 41z in FIG. 5). Similarly, each one of the exclusive-OR gates shown in FIG. 5 receives signals from seven AND gates, each having two inputs. The inputs to the various AND gates are specified in Table IV below.

TABLE IV

| AND of input bits (S1 vector) | XOR along column direction for output bits |
|---|---|
| 1 1 | 1 1 0 0 1 1 1 |
| 1 2 | 0 0 0 1 1 0 1 |
| 1 3 | 0 1 1 1 1 1 0 |
| 1 4 | 0 1 0 0 0 1 0 |
| 1 5 | 0 0 1 0 0 1 0 |
| 1 6 | 1 1 1 1 0 0 1 |
| 1 7 | 0 0 1 1 0 1 0 |
| 2 2 | 1 1 1 0 0 1 1 |
| 2 3 | 1 0 0 0 1 1 0 |
| 2 4 | 0 0 1 1 1 1 1 |
| 2 5 | 0 0 1 0 0 0 1 |
| 2 6 | 0 0 0 1 0 0 1 |
| 2 7 | 1 1 1 1 1 0 0 |
| 3 1 | 1 1 1 1 0 0 1 |
| 3 3 | 0 1 0 0 0 1 1 |
| 3 5 | 1 0 0 1 1 1 1 |
| 3 6 | 1 0 0 1 0 0 0 |
| 3 7 | 1 0 0 0 1 0 0 |
| 4 4 | 1 1 1 1 1 0 0 |
| 4 5 | 1 0 1 0 0 0 1 |
| 4 6 | 1 1 0 0 1 1 1 |
| 4 7 | 0 1 0 0 1 0 0 |
| 5 5 | 0 1 1 1 1 1 0 |
| 5 6 | 1 1 0 1 0 0 0 |
| 5 7 | 1 1 1 0 0 1 1 |
| 6 6 | 0 0 1 1 1 1 1 |
| 6 7 | 0 1 1 0 1 0 0 |
| 7 7 | 1 0 0 1 1 1 1 |

This table is seen to contain seven columns of zeros and ones. As one looks down each of these columns, one finds the corresponding circuit structure for output bits T(1) through T(7) reading from left to right in the table. For example, the column for T(1) has ones in the row designated 1 1, the row 1 6, the row 2 2, the row 2 3, the row 2 7, the row 3 1, the row 3 5, the row 3 6, the row 3 7, the row 4 4, the row 5 5, the row 4 6, the row 5 6, the row 5 7 and the row 7 7. In some instances in the table, the same integer appears in the first two columns of Table IV. In such cases, the AND gate 42a, for example, is unnecessary and may be replaced simply by the single signal line from $s_1$. Thus, it is seen that the first two columns of Table IV indicate which of the bits $s_1$ through $s_7$ are supplied to an AND gate associated with a particular column of zeros and ones in the right-hand portion of Table IV. Thus, there is a 2-input AND gate for each "1" entry in each column of zeros and ones of Table IV. Each of the outputs of these AND gates is supplied to an exclusive-OR gate such as gate 41a for signal T(1). Each exclusive-OR gate has, therefore, as many input signal lines as there are "ones" in the corresponding binary columns of Table IV. The resulting circuit is, therefore, seen to be the one illustrated in FIG. 5. Attention is now directed back to FIG. 3 where it is seen that the output T from transform block 40 is supplied to bit-wise exclusive-OR gates 45 which also receive the signal $s_b$, that is, essentially save for the first bit $s_0$, the second half of syndrome S, this is also referred to herein in the claims as the second half-syndrome with $S_a$ being correspondingly referred to as the first half-syndrome. It is noted that functional block 45 denotes a bit-wise exclusive-OR operation, that is, it contains essentially seven exclusive-OR gates, each of which receives a corresponding signal line from T or $s_b$, each of these signals having 7 bits. Thus, bit-wise exclusive-OR gates 45 produce a 7-bit output referred to herein as P. This signal is one of the signals supplied to error indicator generator 50 discussed more particularly below in reference to FIG. 6.

It is also seen that syndrome S is supplied to all-zero detector 91 which produces a "one" output signal when the syndrome S is "zero" (that is, when it is null or all "zeros"). When this is the case, it is an indication that no error has occurred. All-zero detector 91 supplies signal $s_z$ through inverter 81 to produce signal $s_{nz}$ which is employed in error corrector 60, also discussed below.

It is also noted that various other signals are produced in FIG. 3. In particular, $S_x$ is a single bit signal produced from exclusive-OR gate 92 which produces the modulo 2 sum of eight bits: $s_0$ and bits $s_8$ through $s_{14}$. Two other all-zero detectors are employed in FIG. 3, namely, functional block 93 which produces signal $s_{az}$ which provides an indication that syndrome bits $s_1$ through $s_7$ are all zero. In a similar fashion, all-zero detector 94 provides an indication that all of the bits in signal P are zero. This one bit signal is designated as $P_z$ in FIG. 3.

Signal G is produced by AND gate 85 which receives as inputs an inverted version of signal $s_x$ from inverter gate 93. It also receives an inverted form of signal $s_{az}$ through inverter 82. Lastly, AND gate 85 is provided with signal $P_z$ from all-zero detector 94. The conjunctive summation of these three signals produces signal G which is supplied to OR gate 87 and is used for generating an error indicator for the 0th bit.

Additionally, it is seen that triple input AND gate 86 receives signals $s_x$, $s_{az}$ and $P_z$ to produce output signal F which is supplied to error indicator generator 50.

Figure 6:
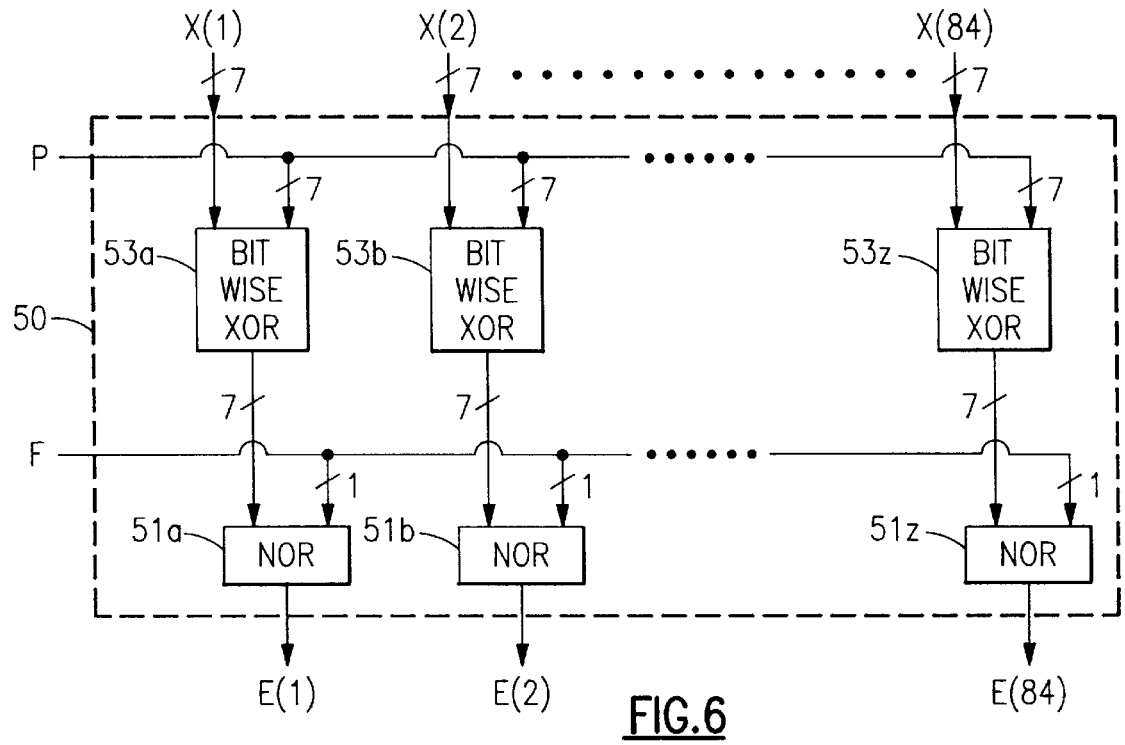
FIG. 6 is likewise a more detailed functional block description of the error indicator generator shown in FIG. 3.

Attention is now directed to the construction of error indicator generator 50, as shown in FIG. 6. This functional block provides 84 output signals reflecting whether or not there is an error in the respective data bit position (E(0) is generated separately from OR-gate 87 which receives signals F and G, as shown in FIG. 3). Each output E(i) from block 50 is the output of a corresponding NOR gate (51a through 51z). Each NOR gate receives as a first input signal F. It also receives a 7-bit input from a bit-wise exclusive-OR gate (see gates 53a through 53z in FIG. 6). In turn, these bit-wise exclusive-OR gates receive, as inputs, signal lines X(i) together with 7-bit signal P from bit-wise exclusive-OR gates 45. In this way, an error indication signal is generated for bit positions 1 through 84. As pointed out above, the signal E(0) is generated separately.

Figure 7:
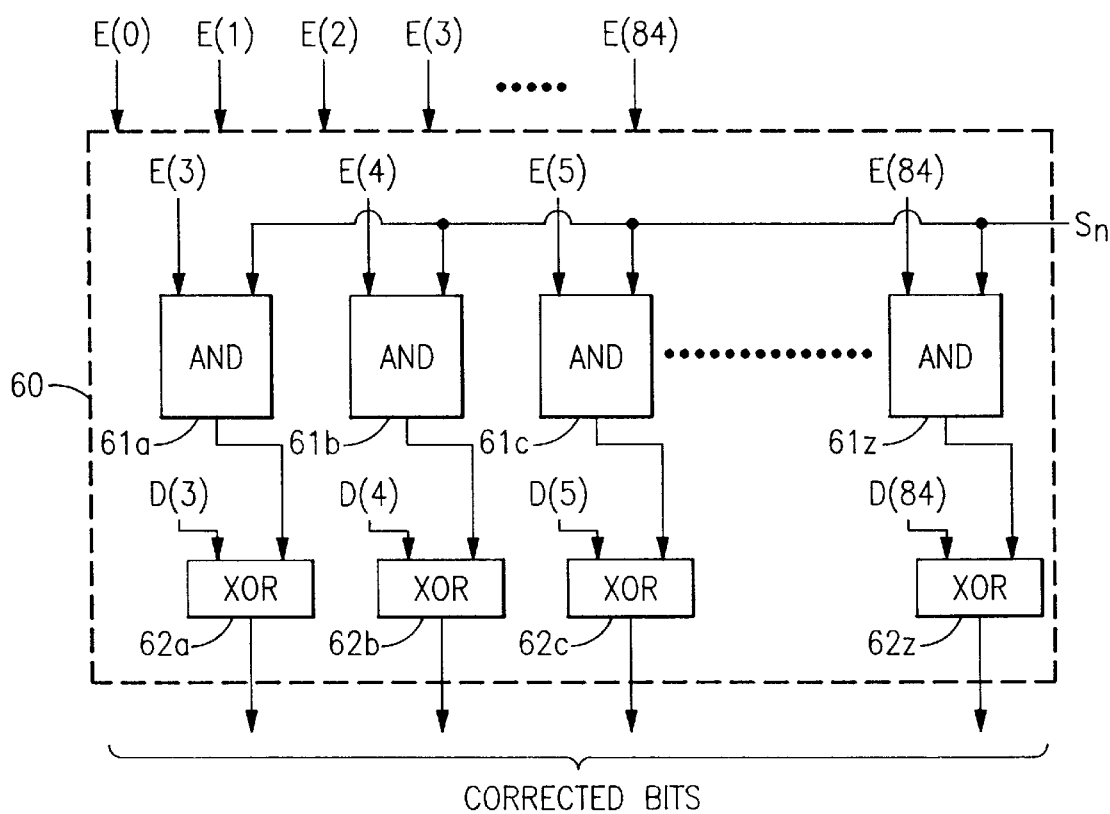
FIG. 7 is a functional block diagram of the error corrector shown in FIG. 3.

Attention is now directed to error corrector 60 whose circuit is shown in FIG. 7. In particular, exclusive-OR gates 62a through 62z provide a conditional inversion for various specified data bits (here, only the data bits themselves are corrected, thus accounting for the specific lack of correction for bits D(0), D(1), D(2), etc., as suggested in FIG. 7). The conditional inversion of a data bit is determined by the output of an AND gate (61a through 61z) which is enabled by signal line $s_n$ which indicates that not all of the syndrome bits are zero. When this is the case, the AND gates in FIG. 7 are enabled so as to permit the correction of the corresponding data bit in accordance with the signals E(1) through E(84) as provided from error indicator generator 50, as seen in FIG. 6.

Figure 8:
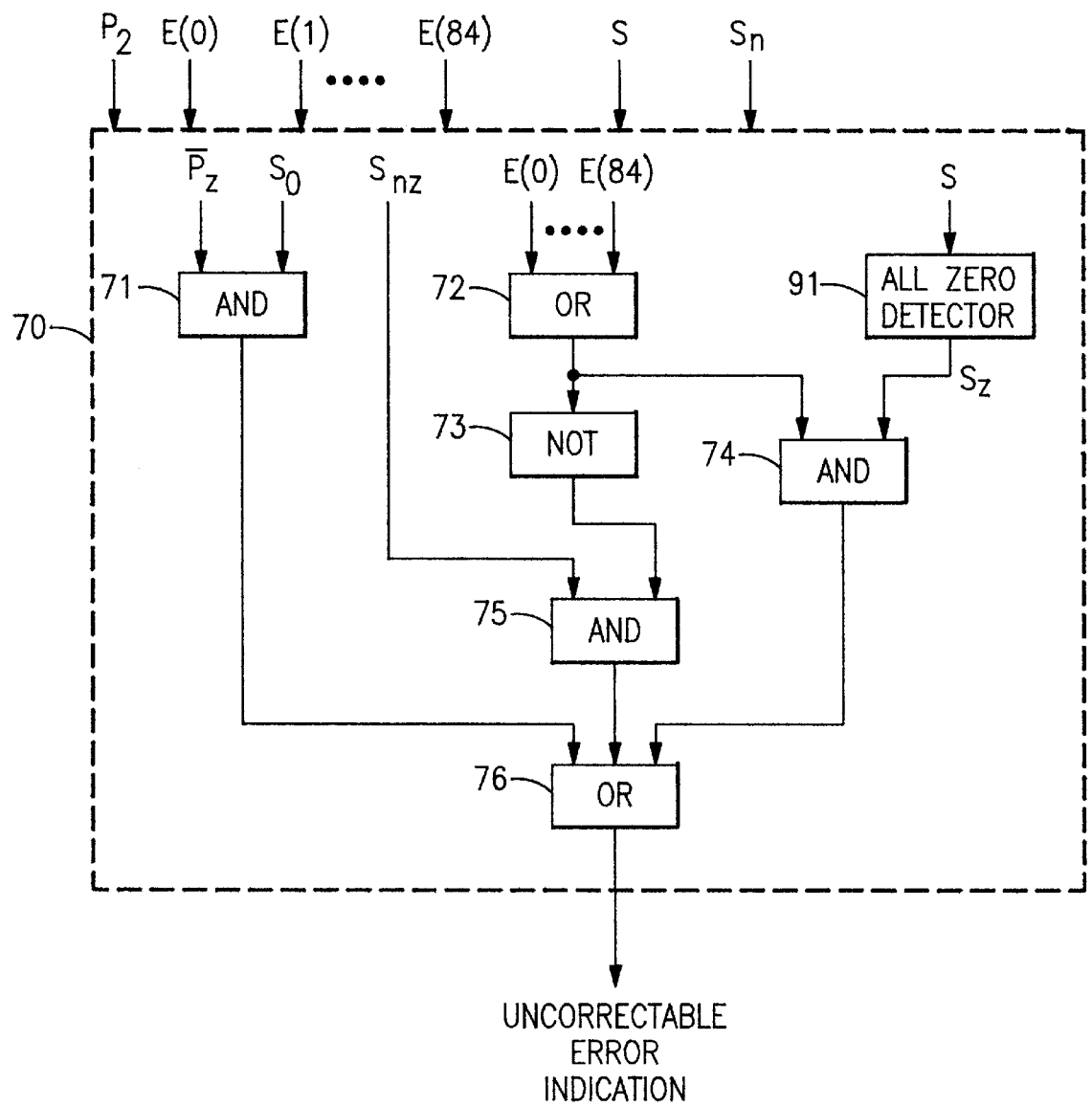
FIG. 8 is a functional block diagram illustrating the structure and function of the uncorrectable error detector circuit shown in FIG. 3.

Likewise, an uncorrectable error indication is provided by the circuit shown in functional block 70 in FIG. 8 which provides a more detailed view of the block shown in FIG. 3. An uncorrectable error occurs when any of the signals supplied to OR-gate 76 is a "1". In particular, such a signal may be provided by AND-gate 71 which has as inputs thereof signals $s_0$ and the inverted form of $P_z$. It is additionally seen in FIG. 8 that if any of signals E(0) through E(84) are not zero, an indication of this is provided by the output of OR-gate 72. An inverted form of this signal is provided from inverter 73 to AND-gate 75 along with signal $s_{nz}$. This signal is thence supplied from AND-gate 75 through OR-gate 76 to provide a signal indicating that a particular uncorrectable error situation has arisen. Lastly, with respect to functional block 70, it is seen that the output from all-zero detector 91 is also supplied to AND-gate 74 together with the output of OR-gate 72. This provides yet another uncorrectable error indication since the output of AND-gate 74 is fed directly to OR-gate 76. The generation of an uncorrectable error indication signal is certainly desirable though optional in many circumstances.

From the above, it should be appreciated that the above-described invention fully satisfies the objectives set forth herein. In particular, it is seen that problem of double error correction and triple error detection for an 85-bit binary code has been satisfied. It is also furthermore important to appreciate that the present invention satisfies a number of important and desirable features which are not known to be present in any other code of this size or nature.

It should be especially appreciated herein that the design of parity check matrices using BCH coding theory is not simply a matter of selecting the right polynomials or the right primitive roots. There are many additional aspects to the design including considerations of circuit size and complexity. Furthermore, there are also considerations with respect to modularity of the circuit and the selection of a design which meets packaging constraints. And most importantly, one must not design a code without some consideration of the nature and complexity of the circuit that is going to be required to perform the decoding operation, that is, the operation of actually detecting and correcting errors. In the present situation, it is seen that the inventor has provided a decoding method and circuit which is simple, fast, efficient and economical and yet which implements all of the error correction and detection properties desired to be built into the code of the specified length. Accordingly, it is seen that the design of an encoding and decoding system for error detection and correction is not a simple or trivial matter, especially when the encoding and decoding systems are meant to work in conjunction with one another.

While the invention has been described in detail herein in accordance with certain preferred embodiments thereof, many modifications and changes therein may be effected by those skilled in the art. Accordingly, it is intended by the appended claims to cover all such modifications and changes as fall within the true spirit and scope of the invention.

The invention claimed is:

1. An electrical circuit for encoding input digital electrical signals representing binary data so as to produce output digital electrical check bit signals which satisfy linear constraint conditions which are determined by a parity check matrix H of the form $$H = \begin{pmatrix} 1 & \beta & \beta & \beta & \beta & \beta & \beta & \beta \\ O_7 & H_0 & RH_0 & R^2H_0 & R^3H_0 & R^4H_0 & R^5H_0 & R^6H_0 \\ O_7 & H_1 & RH_1 & R^2H_1 & R^3H_1 & R^4H_1 & R^5H_1 & R^6H_1 \end{pmatrix}$$

wherein $\beta$ is row vector (000100101001), $O_7$ is column vector $(000000)^t$, $H_0$ is binary matrix $$\begin{bmatrix} 1 & 0 & 1 & 0 & 1 & 0 & 0 & 0 & 0 & 0 & 1 & 1 \\ 0 & 0 & 0 & 0 & 0 & 0 & 0 & 1 & 1 & 0 & 0 & 0 \\ 0 & 0 & 1 & 1 & 0 & 1 & 0 & 0 & 0 & 1 & 0 & 0 \\ 0 & 0 & 0 & 0 & 0 & 1 & 0 & 0 & 0 & 1 & 0 & 0 \\ 0 & 0 & 1 & 0 & 0 & 1 & 1 & 1 & 0 & 0 & 0 & 0 \\ 0 & 0 & 0 & 1 & 1 & 0 & 0 & 0 & 0 & 0 & 0 & 1 \\ 0 & 0 & 1 & 1 & 1 & 1 & 1 & 0 & 0 & 1 & 0 & 1 \end{bmatrix}$$

and $H_1$ is binary matrix $$\begin{bmatrix} 0 & 1 & 1 & 0 & 1 & 1 & 0 & 1 & 1 & 0 & 1 & 0 \\ 0 & 0 & 0 & 0 & 0 & 0 & 1 & 0 & 1 & 1 & 1 & 0 \\ 0 & 0 & 1 & 0 & 0 & 0 & 0 & 1 & 1 & 1 & 1 & 0 \\ 0 & 0 & 0 & 1 & 0 & 0 & 0 & 1 & 1 & 0 & 0 & 1 \\ 0 & 0 & 0 & 0 & 0 & 1 & 0 & 0 & 1 & 1 & 1 & 1 \\ 0 & 0 & 1 & 0 & 0 & 1 & 0 & 0 & 0 & 0 & 0 & 0 \\ 0 & 0 & 0 & 0 & 1 & 0 & 1 & 0 & 0 & 1 & 0 & 1 \end{bmatrix}$$

and wherein R is a permutation matrix which cyclically shifts one row at a time.

2. A method for encoding input digital electrical signals representing binary data comprising the step of transforming said input electrical signals by means of an electrical circuit so as to produce output digital electrical check bit signals which satisfy linear constraint conditions which are determined by a parity check matrix H of the form $$H = \begin{pmatrix} 1 & \beta & \beta & \beta & \beta & \beta & \beta & \beta \\ O_7 & H_0 & RH_0 & R^2H_0 & R^3H_0 & R^4H_0 & R^5H_0 & R^6H_0 \\ O_7 & H_1 & RH_1 & R^2H_1 & R^3H_1 & R^4H_1 & R^5H_1 & R^6H_1 \end{pmatrix}$$

wherein $\beta$ is row vector (000100101001), $O_7$ is column vector $(000000)^t$, $H_0$ is binary matrix $$\begin{bmatrix} 1 & 0 & 1 & 0 & 1 & 0 & 0 & 0 & 0 & 0 & 1 & 1 \\ 0 & 0 & 0 & 0 & 0 & 0 & 0 & 1 & 1 & 0 & 0 & 0 \\ 0 & 0 & 1 & 1 & 0 & 1 & 0 & 0 & 0 & 1 & 0 & 0 \\ 0 & 0 & 0 & 0 & 0 & 1 & 0 & 0 & 0 & 1 & 0 & 0 \\ 0 & 0 & 1 & 0 & 0 & 1 & 1 & 1 & 0 & 0 & 0 & 0 \\ 0 & 0 & 0 & 1 & 1 & 0 & 0 & 0 & 0 & 0 & 0 & 1 \\ 0 & 0 & 1 & 1 & 1 & 1 & 1 & 0 & 0 & 1 & 0 & 1 \end{bmatrix}$$

and $H_1$ is binary matrix $$\begin{bmatrix} 0 & 1 & 1 & 0 & 1 & 1 & 0 & 1 & 1 & 0 & 1 & 0 \\ 0 & 0 & 0 & 0 & 0 & 0 & 1 & 0 & 1 & 1 & 1 & 0 \\ 0 & 0 & 1 & 0 & 0 & 0 & 0 & 1 & 1 & 1 & 1 & 0 \\ 0 & 0 & 0 & 1 & 0 & 0 & 0 & 1 & 1 & 0 & 0 & 1 \\ 0 & 0 & 0 & 0 & 0 & 1 & 0 & 0 & 1 & 1 & 1 & 1 \\ 0 & 0 & 1 & 0 & 0 & 1 & 0 & 0 & 0 & 0 & 0 & 0 \\ 0 & 0 & 0 & 0 & 1 & 0 & 1 & 0 & 0 & 1 & 0 & 1 \end{bmatrix}$$

and wherein R is a permutation matrix which cyclically shifts one row at a time.

* * * * *